United States Patent [19]

Stubb

[11] Patent Number: 4,492,621
[45] Date of Patent: Jan. 8, 1985

[54] METHOD AND APPARATUS FOR ELECTRODEPOSITION OF MATERIALS

[76] Inventor: Paul R. Stubb, 3032 Stearns Dr., Orange, Calif. 92669

[21] Appl. No.: 427,849

[22] Filed: Sep. 29, 1982

[51] Int. Cl.³ ............................................... C25D 21/10
[52] U.S. Cl. ..................................... 204/261; 204/273
[58] Field of Search ........................ 204/273, 222, 261

[56] References Cited

U.S. PATENT DOCUMENTS

| 1,186,898 | 6/1916 | Greenawalt | 204/261 |
| 1,362,082 | 12/1920 | Cowper-Coles | 204/273 |
| 1,411,657 | 4/1922 | Duncan | 204/273 |
| 3,558,455 | 1/1971 | Sorensen | 204/273 |
| 4,139,429 | 2/1979 | Steward | 204/273 |
| 4,279,706 | 7/1981 | Blanc | 204/273 |

Primary Examiner—T. M. Tufariello
Attorney, Agent, or Firm—Paul R. Wylie

[57] ABSTRACT

An electrodeposition method and apparatus wherein improved efficiency in the operation of an electrodeposition cell is obtained by providing an electrolyte confining area around the cathode in the cell and inducing positive flow of the electrolyte into and out of the confined area to increase the volume of electrolyte per unit time coming into contact with the cathode when the cell is operating.

9 Claims, 4 Drawing Figures

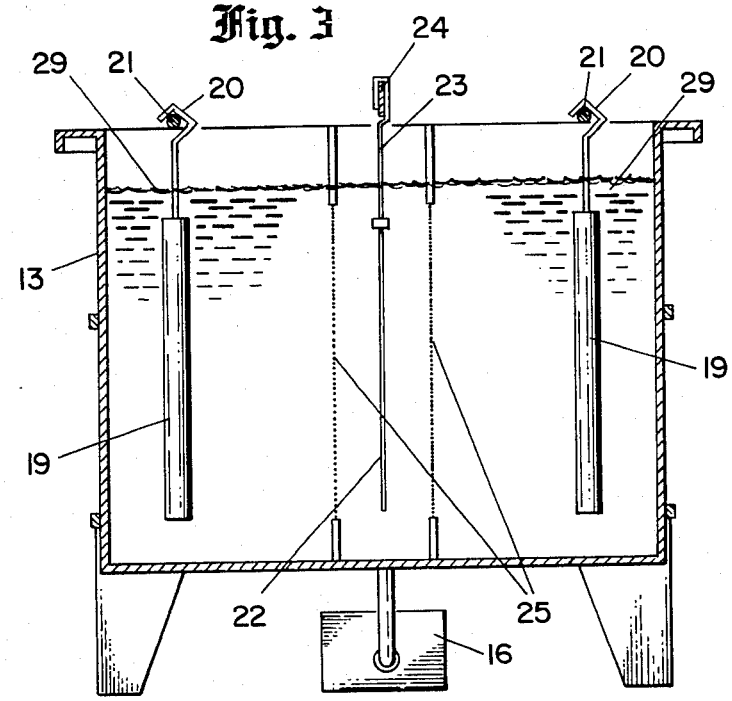
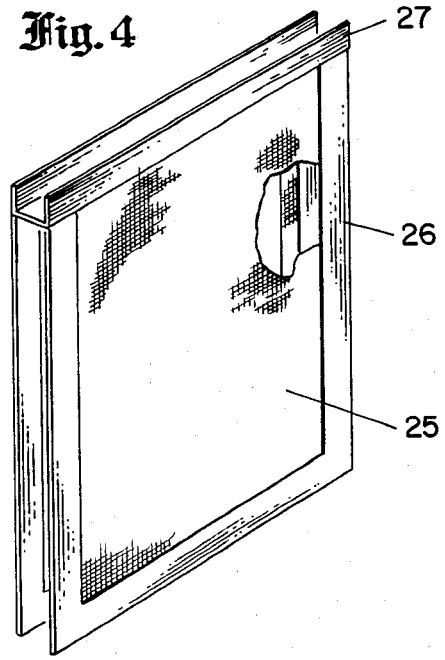

20 4,492,621

METHOD AND APPARATUS FOR ELECTRODEPOSITION OF MATERIALS

SUMMARY

This invention relates generally to methods and apparatus for electrodeposition of materials. More specifically, it relates to such methods and apparatus wherein improved efficiency in the operation of an electrodeposition cell is obtained by the techniques of the invention wherein an electrolyte confining area around the cathode(s) of the cell is defined and positive flow of the electrolyte into and out of the confined area is effected to increase the volume of electrolyte per unit time coming into contact with the cathode when the cell is operating.

A feature of the invention is the provision of a means to confine the electrolyte flow in the area of the cathode while at the same time permitting ions to be freely exchanged between the anode and cathode.

It is the object of this invention to provide an apparatus and method of electrodeposition of materials in an efficient manner.

Another object of the invention is the provision of a method and apparatus and improving electrodeposition efficiency without major redesign of existing electrodeposition cells wherein the efficiency of the existing cells can be increased.

BRIEF DESCRIPTION OF THE INVENTION

According to the invention there is provided an electrodeposition cell apparatus including anode means and cathode means being positioned in the tank means of said cell such that said anode and cathode means are at least partially submerged in an electrolyte contained in said tank when the cell is in operation. Means are provided within the tank in the area of the cathode to define an electrolyte confining area with said means being at the same time capable of permitting ions to be freely exchanged between the anode and cathode of the cell. Also provided are means to promote flow of the electrolyte solution in the confined area around the cathode and to circulate electrolyte in said confined area to and from the other areas of the tank.

In the method according to the invention there is provided a technique for operating an electrodeposition cell of the type wherein anode means and cathode means are at least partially submerged in an electrolyte contained in a tank. The improvement according to the method of the invention entails the confining of a portion of the electrolyte in the area of the cathode and promoting flow of electrolyte into such area from the remainder of the tank means of the electrodeposition cell while at the same time permitting ions to be freely exchanged between the anode and cathode whereby the volume for the electrolyte per unit time in contact with the cathode is increased during the operation of the cell.

DESCRIPTION OF THE DRAWINGS

The invention will be more fully understood by referring to the accompanying drawings wherein:

FIG. 3 is a left-side elevation view of the electrodeposition cell shown in FIG. 1 with parts thereof broken away for convenience of illustration; and FIG. 4 is a view in perspective of the electrolyte confining means according to the invention.

DETAILED DESCRIPTION OF THE INVENTION

Figure 1:
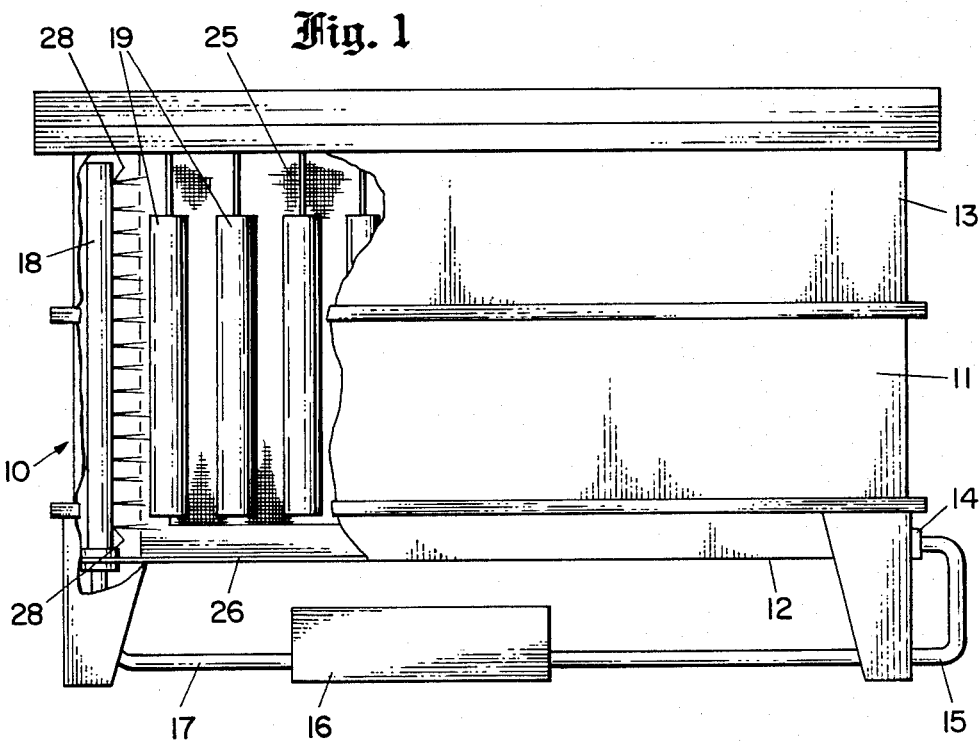
FIG. 1 is a front evaluation view of an electrodeposition cell including an electrolyte confining means according to the invention with parts thereof broken away for convenience of illustration.
Figure 2:
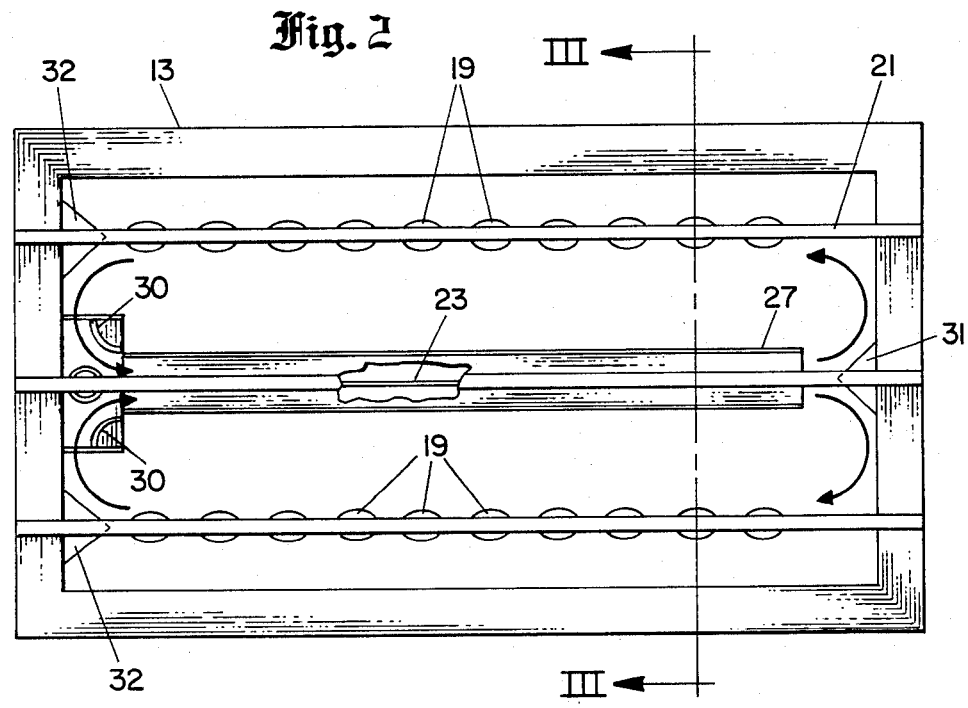
FIG. 2 is a top plan view of the electrodeposition cell shown in FIG. 1.

With reference to the drawings generally described above, the following is a detailed description of the invention.

An electrodeposition cell 10 for electroplating various articles is provided and includes as electrolyte containing tank 11 which consist of a bottom member 12 and side members 13. The cell 10 further includes an electrolyte outlet 14 which is connected by pipe 15 to recirculation pump 16 which is in turn connected by pipe 17 to electrolyte distribution header pipe 18.

Anode rods 19 are suspended by means of hangers 20 from anode hanging bar 21. Cathode 22 is suspended by cathode hanging rod 23 which is suspended from cathode hanging bar 24.

Means are provided within the cell to confine a portion of the electrolyte in the area of the cathode 22 while permitting ions to be freely exchanged between the cathode 22 and the anode 19. Such means are nonconductive and in a preferred embodiment is an ion permeable sheet material such as the plastic screen material 25 which is positioned in a framework 26 and held in position on the tank by means of brackets 27.

As can best be seen in FIG. 3 of the drawings, plastic screen material 25 is placed on both sides of cathode 22 with said screen material being in parallel position with respect to the cathode on opposite sides thereof.

Elongated electrolyte distribution header pipe 18 is provided along its length with apertures 28 to provide a high velocity stream of electrolyte entering the tank 11.

In operation an electrolyte 29 and cathodes and anodes 22 and 19 respectively are placed in the tank 11. Electrolyte is withdrawn from the tank 11 through electrolyte outlet 14 and passes through pipe 15 to pump 16 which supplies the electrolyte under pressure to pipe 17 and distribution header pipe 18. The pressurized electrolyte enters the tank through apertures 28 at a high velocity and passes around the cathode 22 and then is circulated into the remainder of the tank. The high velocity introduced electrolyte is maintained in the area of the cathode by the screens 25. Although these screens 25 serve to confine the electrolyte in the area of the cathode 22, they are nevertheless ion permeable so that ions may flow from the anode 19 to the cathode 22.

Baffles 30 which are used in one preferred embodiment of the invention serve to direct the flow of high velocity electrolyte from the tank 11 in the direction of the cathode and enhance the flow velocity by forming a venturi arrangement whereby the electrolyte from the tank is accelerated by the flow from apertures 28. At the opposite end of the flow zone around the cathode the electrolyte flows into the main portion of tank 11 assisted by splitter baffle 31 which directs the flow to either side of its apex. Baffles 32 in tank 11 further aid in directing the electrolyte flow and eliminate "dead spots" in the corner of the tank where electrolyte might not readily circulate. It is to be emphasized that the zone defined by screens 25 around cathode 22 is open to the extent that electrolyte in said zone will seek the electrolyte level in the tank by both means of the openings at the end of the zone and the permability of the material itself while at the same time such material does not necessarily have to be permeable to the electrolyte. It must, however, be permeable to the ion flow from the cathode 22 and anode 19.

The advantage of the invention has been shown in tests using a current density of 100 amps per square foot and a copper anode in a standard acid copper (CuSO$_4$) bath. In such tests, a uniform coating on the cathode was made in 16 minutes as contrasted to the usual time of 104 minutes at a current density of 25 amps per square foot. The foregoing data indicates that due to the increased movement and mass transfer of the electrolyte around the cathode according to the invention, the current density can be increased to obtain shorter electrodeposition times.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description; and all changes which come within the meaning and range of equivalency of the claims are therefore intended to be embraced therein.

What is claimed is:

1. An electrodeposition cell comprising:
   (a) a fluid containing tank means;
   (b) anode means being positioned in said tank means such that said anode means will be at least partially submerged in an electrolyte contained in said cell when said cell is in operation;
   (c) at least one cathode means positioned in said tank means such that said cathode means will be at least partially submerged in said electrolyte contained in said cell when said cell is in operation;
   (d) means positioned within said tank means capable of confining a portion of said electrolyte in the area of said cathode, while at the same time permitting ions to pass therethrough and to be freely exchanged between said anode and cathode means when said cell is in operation;
   (e) means to promote a high velocity flow of electrolyte parallel to the face of the cathode through the area around said cathode defined by said electrolyte confining means; and
   (f) means to circulate said electrolyte into the confined area around said cathode to and from other areas of said fluid containing tank means.

2. An elctrodeposition cell according to claim 1 wherein said means within said tank means to confine said electrolyte comprise a nonconductive ion permeable material.

3. An electrodeposition cell according to claim 2 wherein said nonconductive ion permeable material is a sheet material.

4. An electrodeposition cell according to claim 3 wherein said sheet material is a plastic screen material.

5. An electrodeposition cell according to claim 2 wherein said cathode means is in the form of a plate and said sheet material is spaced from and substantially parallel with said cathode plate on opposite side thereof.

6. An electrodeposition cell according to claim 5 wherein said cathode means is a circuit board.

7. An electrodeposition cell according to claim 5 further comprising a vertically deposed electrolyte distribution header pipe positioned at one end of said confined area around said cathode means, said header pipe being provided with a plurality of apertures spaced along its length, said apertures being positioned such to provide a flow of electrolyte in the direction of the cathode means when said electrolyte is introduced to said pipe under pressure.

8. An electrodeposition cell according to claim 7 further comprising an electrolyte outlet in said tank means at the opposite end of said confined area around said cathode from said vertically deposed electrolyte distribution header pipe and pump means adapted to pump electrolyte from said electrolyte outlet to said vertically deposed electrolyte distribution header pipe.

9. An electrodeposition cell according to claim 7 further comprising baffle means located adjacent to the apertures of said vertically deposed electrolyte distribution header so as to form a venturi arrangement whereby electrolyte from said tank means is accelerated by the flow of electrolyte from the apertures in said distribution header.

* * * * *